(12) United States Patent
Hu et al.

(10) Patent No.: US 12,334,384 B2
(45) Date of Patent: Jun. 17, 2025

(54) METHODS AND APPARATUS FOR MINIMIZING SUBSTRATE BACKSIDE DAMAGE

(71) Applicant: Applied Materials, Inc., Santa Clara, CA (US)

(72) Inventors: Liangfa Hu, San Jose, CA (US); Abdul Aziz Khaja, San Jose, CA (US); Sarah Michelle Bobek, Sunnyvale, CA (US); Prashant Kumar Kulshreshtha, San Jose, CA (US); Yoichi Suzuki, Funabashi (JP)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/233,751

(22) Filed: Aug. 14, 2023

(65) Prior Publication Data

US 2023/0386883 A1     Nov. 30, 2023

Related U.S. Application Data

(63) Continuation of application No. 16/855,206, filed on Apr. 22, 2020, now Pat. No. 11,756,819.
(Continued)

(51) Int. Cl.
*H01L 21/683*     (2006.01)
*H01L 21/26*     (2006.01)
*H01L 21/687*     (2006.01)

(52) U.S. Cl.
CPC ......... *H01L 21/6833* (2013.01); *H01L 21/26* (2013.01); *H01L 21/68735* (2013.01)

(58) Field of Classification Search
CPC ............... H01L 21/6833; H01L 21/26; H01L 21/68735; H01L 21/6831; H01L 21/68757; H01L 21/6875; H01L 21/67103
See application file for complete search history.

(56) References Cited

U.S. PATENT DOCUMENTS 6,392,350 B1    5/2002   Amano
7,672,110 B2    3/2010   Sun et al.
(Continued)

FOREIGN PATENT DOCUMENTS

CN     101765900 A    6/2010
CN     101911281 A    12/2010
(Continued)

OTHER PUBLICATIONS

Singapore Search Report and Written Opinion dated Oct. 19, 2023 for Application No. 11202112558T.
(Continued)

*Primary Examiner* — Ermias T Woldegeorgis
(74) *Attorney, Agent, or Firm* — Patterson + Sheridan, LLP

(57) ABSTRACT

Embodiments of the present disclosure generally relate to apparatus and methods for reducing substrate backside damage during semiconductor device processing. In one implementation, a method of chucking a substrate in a substrate process chamber includes exposing the substrate to a plasma preheat treatment prior to applying a chucking voltage to a substrate support. In one implementation, a substrate support is provided and includes a body having an electrode and thermal control device disposed therein. A plurality of substrate supporting features are formed on an upper surface of the body, each of the substrate supporting features having a substrate supporting surface and a rounded edge.

17 Claims, 6 Drawing Sheets

Related U.S. Application Data

(60) Provisional application No. 62/848,935, filed on May 16, 2019.

(56) References Cited

U.S. PATENT DOCUMENTS

| | | | |
|---|---|---|---|
| 8,390,980 | B2 | 3/2013 | Sansoni et al. |
| 9,001,489 | B2 | 4/2015 | Boyd, Jr. et al. |
| 9,358,702 | B2* | 6/2016 | Banda ............... H01L 21/67103 |
| 9,916,998 | B2 | 3/2018 | Sun et al. |
| 10,020,218 | B2 | 7/2018 | Boyd, Jr. et al. |
| 2005/0230047 | A1 | 10/2005 | Collins et al. |
| 2006/0231032 | A1* | 10/2006 | Murakami ........ H01L 21/28556 |
| | | | 700/121 |
| 2012/0070914 | A1 | 3/2012 | Dhindsa et al. |
| 2012/0097330 | A1 | 4/2012 | Iyengar et al. |
| 2016/0049323 | A1* | 2/2016 | Ye ...................... H01L 21/6833 |
| | | | 361/234 |
| 2017/0140970 | A1* | 5/2017 | Boyd, Jr. ................. C03C 17/00 |
| 2017/0243778 | A1 | 8/2017 | Kouno et al. |
| 2018/0301364 | A1 | 10/2018 | Boyd, Jr. et al. |
| 2019/0067069 | A1* | 2/2019 | Glasko ................ H01L 21/6833 |
| 2019/0080949 | A1* | 3/2019 | Boyd, Jr. ............. C23C 16/4585 |
| 2020/0027774 | A1 | 1/2020 | Goller et al. |
| 2020/0365441 | A1 | 11/2020 | Hu et al. |

FOREIGN PATENT DOCUMENTS

| | | | | |
|---|---|---|---|---|
| CN | 106663653 | A | | 5/2017 |
| CN | 108064411 | A | | 5/2018 |
| JP | 2005191561 | A | * | 7/2005 ....... H01L 21/67109 |
| JP | 2017191949 | A | | 10/2017 |
| KR | 20060046920 | A | | 5/2006 |
| WO | WO-2017139163 | A1 | * | 8/2017 ............... B23Q 3/15 |

OTHER PUBLICATIONS

International Search Report and Written Opinion for Application No. PCT/US2020/029203 dated Aug. 7, 2020.
Chinese Office Action dated Jul. 16, 2024, for Chinese Patent Application No. 202080041770.4.
Chinese Office Action dated Feb. 10, 2025, for Chinese Patent Application No. 202080041770.4.

* cited by examiner

METHODS AND APPARATUS FOR MINIMIZING SUBSTRATE BACKSIDE DAMAGE

CROSS-REFERENCE TO RELATED APPLICATIONS

This application is a continuation to U.S. application Ser. No. 16/855,206, filed Apr. 22, 2020, which claims benefit of U.S. Appl. No. 62/848,935, filed May 16, 2019, which is herein incorporated by reference in its entirety.

BACKGROUND

Field

Embodiments of the present disclosure generally relate to methods and apparatus for minimizing substrate backside damage for semiconductor device processing.

Description of the Related Art

An electrostatic chuck holds and supports a substrate during a manufacturing process without mechanically clamping the substrate. The surface of the electrostatic chuck may be flat or may have one or more protrusions, projections, or other substrate supporting features. During use of an electrostatic chuck, the backside of a substrate, such as a semiconductor substrate, is held to the face of the electrostatic chuck by electrostatic forces that are generated from one or more electrodes embedded in the electrostatic chuck.

The electrostatic forces that hold the substrate against the electrostatic chuck may cause unwanted backside puncture damage to the substrate, particularly when the electrostatic chuck includes raised substrate supporting features. Additionally, thermal expansion of the substrate during high processing temperatures can result in sliding of the backside of the substrate along the electrostatic chuck, resulting in backside scratch damage. Such defects lead to lithographic defocus and significantly impact production yield of lithographic processes. Due to the large number of lithographic operations utilized in integrated circuit manufacturing, lithography accounts for about one-third of integrated circuit manufacturing costs, and thus, such defects create a burden on overall integrated circuit fabrication.

Accordingly, what is needed in the art are improved methods and apparatus for electrostatic chucking of substrates.

SUMMARY

In one embodiment, a substrate support is provided. The substrate support includes a body having an electrode and a temperature control device disposed therein. A plurality of substrate supporting features are formed on a substrate supporting region of the substrate support, and each of the substrate supporting features have a substrate supporting surface and a rounded edge. A ratio of a distance between adjacent substrate supporting features and a diameter of the substrate supporting region is between about 0.01 and about 2.

In another embodiment, a method of chucking a substrate in a substrate process chamber is provided. The method includes placing a substrate on a substrate support within a process volume and exposing the substrate to a preheat treatment. The preheat treatment further includes flowing one or more inert process gases into the process volume at a flow rate between about 500 sccm and about 5000 sccm and maintaining the process volume at pressure between about 1 Torr and about 20 Torr. A chucking voltage is applied to the substrate support after exposing the substrate to the preheat treatment.

In yet another embodiment, a method of chucking a substrate in a substrate process chamber is provided. The method includes placing a substrate on a substrate support having a body with an electrode and temperature control device disposed therein. A plurality of substrate supporting features are formed on a substrate supporting region of the substrate support. Each of the substrate supporting features has a substrate supporting surface and a rounded edge. A ratio of the distance between adjacent substrate supporting features and a diameter of the substrate supporting region is between 0.01 and about 0.2. The method further includes exposing the substrate to a plasma preheat treatment and applying a chucking voltage to the substrate support. The plasma preheat treatment includes flowing one or more inert gases into a process volume at a flow rate between about 1000 sccm and about 3000 sccm, generating a plasma from the inert gases, and maintaining the plasma in the process volume for a residence time between about 10 seconds and about 200 seconds. The inert gases are selected from a group consisting of helium, argon, and nitrogen.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to apparatus and methods for reducing substrate backside damage during semiconductor device processing. In one implementation, a method of chucking a substrate in a substrate process chamber includes exposing the substrate to a plasma preheat treatment prior to applying a chucking voltage to a substrate support. In one implementation, a substrate support is provided and includes a body having an electrode and thermal control device disposed therein. A plurality of substrate supporting features are formed on an upper surface of the body, each of the substrate supporting features having a substrate supporting surface and a rounded edge.

Figure 1:
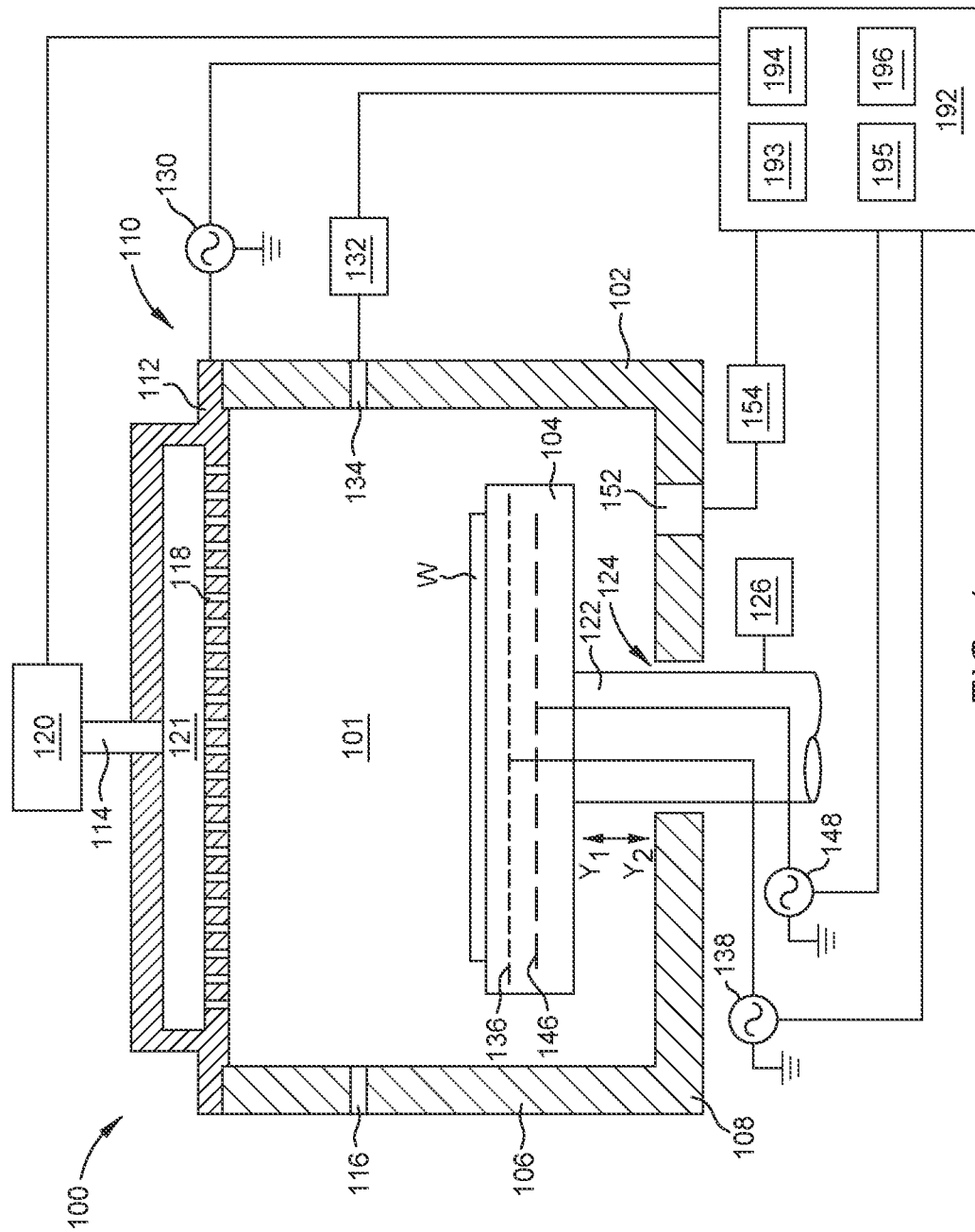
FIG. 1 illustrates a schematic cross-sectional view of an exemplary process chamber according to an embodiment of the disclosure.

FIG. 1 is a schematic cross-sectional view of an exemplary process chamber 100 according to one embodiment. The process chamber 100 may be plasma process chamber, such as a plasma enhanced chemical vapor deposition (PECVD) chamber or other plasma enhanced process chamber. An exemplary process chamber which may benefit from the embodiments described herein is the PRODUCER® series of PECVD enabled chambers available from Applied Materials, Inc., Santa Clara, CA. It is contemplated that other similarly equipped process chambers from other manufacturers may also benefit from the embodiments described herein.

The process chamber 100 includes a chamber body 102 having sidewalls 106 and a chamber bottom 108 at least partially defining a process volume 101. In one embodiment, the chamber body 102 has a polygonal shape, such as a cubic shape or the like. In another embodiment, the chamber has a substantially cylindrical shape. The chamber body 102 is fabricated from a material suitable for maintaining a vacuum pressure environment therein, such as a metallic material. For example, the chamber body 102 is fabricated from aluminum or stainless steel. In one embodiment, grounded internal surfaces (i.e. chamber body 102) inside the chamber 100 are coated with a process compatible material such as silicon, carbon, silicon-carbon materials, or silicon oxide materials. In another embodiment, grounded internal surfaces inside the chamber 100 are coated with a material such as aluminum oxide, yttrium oxide, zirconium oxide, or the like. The process volume 101 is accessed through an opening 116, such as a slit valve, disposed in the sidewalls 106 that facilitates movement of a substrate W into and out of the process chamber 100.

A lid assembly 110 is coupled to the chamber body 102 and further defines the process volume 101. In one embodiment, the lid assembly 110 is formed from an electrically conductive material, such as the materials utilized to fabricate the chamber body 102. The lid assembly 110 includes a gas distribution member 112. In one embodiment, the gas distribution member 112 is a gas distribution plate suspended in the process volume by a backing plate (not shown) coupled to the lid assembly 110. The gas distribution member 112 includes a plurality of openings 118 for flowing one or more process gases into the process volume 101. The plurality of openings 118 are formed such that the process gases are uniformly distributed in the process volume 101. The process gases may be supplied from a gas source 120 and into a gas mixing region 121 via a conduit 114 prior to flowing through the openings 118 and into the process volume 101.

In one embodiment, the gas distribution member 112 is further coupled to a power source 130, such an RF power source. The RF power source may supply a continuous and/or pulsed RF power to the gas distribution member 112. The power source 130 is activated during operation of the process chamber 100 to supply an RF power to the gas distribution member 112 and facilitate the generation of an electric field between the gas distribution member 112 and a substrate support 104. In operation, process gases present between the gas distribution member 112 and the substrate support 104 are energized by the RF electric field into a capacitively coupled plasma. Various RF frequencies may be used to generate the capacitively coupled plasma, such as a frequency of about 13.56 MHz.

In another embodiment, the process chamber 100 includes an antenna comprising at least one RF coil (not shown) coupled to the power source 130. The RF coil may be disposed above the process chamber 100 and may be configured to inductively couple RF power supplied by the power source 130 to the processes gases provided to the process volume 101 through the conduit 114, thus generating an inductively coupled plasma.

In one embodiment, the process chamber 100 is fluidly coupled to a remote plasma source 132. The remote plasma source 132 may be an inductively coupled remote plasma source, a capacitively coupled remote plasma source, or a microwave remote plasma source, depending upon the desired implementation. The remote plasma source 132 may be utilized to assist in plasma generation within the process chamber 100. The remote plasma source 132 is coupled to the process volume 101 through an inlet 134 disposed though the sidewalls 106. Alternatively or in addition to, the remote plasma source 132 may be coupled to the process volume 101 through the lid assembly 110.

The substrate support 104 is centrally disposed within the process chamber 100. The substrate support 104 supports the substrate W during processing. In one embodiment, the substrate support 104 is coupled to a shaft 122 disposed through an opening 124 formed in the chamber bottom 108. In one embodiment, the substrate support 104 is movable by a lift mechanism 126, such as a motor or linear actuator, in a first or second axial direction $Y_1$ or $Y_2$. The substrate support 104 includes an electrode 136 and an electrode power supply 138 electrically coupled to the electrode 136. The electrode power supply 138 is configured to supply a chucking voltage and/or RF power to the electrode 136. The substrate support 104 may also include a temperature control device 146, such as a resistive heater, coupled to a temperature control power source 148 to facilitate heating of the substrate W disposed thereon. Other heating and/or cooling methods may be used in combination with the resistive heating apparatus. In some embodiments, the substrate support 104 has openings formed therein through which a plurality of lift pins (not shown) may be movably disposed. Projection of the lift pins may move a substrate W away from the substrate support 104 and toward the lid assembly 110, and facilitate interfacing of the substrate W with a substrate transfer apparatus, such as a robot blade or the like.

The substrate W is shown disposed on the substrate support 104. The substrate W may be fabricated from materials such as crystalline silicon (e.g. Si<100> or Si<111>), silicon oxide, strained silicon, silicon germanium, germanium, doped or undoped polysilicon, doped or undoped silicon wafers, patterned or non-patterned wafers, silicon on insulator (SOI), carbon doped silicon oxides, silicon nitride, doped silicon, gallium arsenide, glass, or sapphire. The substrate W may have various dimensions, such as 200 mm, 300 mm, 450 mm, or other diameter length, and can be circular, rectangular, or square in shape. The substrate W may have one or more layers formed on the backside (i.e. non-device side) of the substrate W, such as silicon oxide, silicon nitride, amorphous silicon, or any combination thereof (collectively referred to as backside layers). In one embodiment, the backside layer is tri-layer stack including silicon nitride, amorphous silicon, and silicon oxide, with the silicon nitride being in physical contact with the backside of the substrate W.

An exhaust 152 is formed in the chamber body 102 at a location below the substrate support 104. For example, the exhaust 152 may be formed through chamber bottom 108 or the sidewalls 106. The exhaust 152 is coupled to a vacuum pump 154 to remove unreacted species and by-products from the process volume 101.

The process chamber 100 includes a controller 192 that is configured to control one or more of the components of the chamber 100. The controller 192 includes a central processing unit (CPU) 193, support circuitry 194, and memory 195 containing associated control software 196. The controller 192 may be one of any form of a general purpose computer processor that can be used in an industrial setting for controlling various chambers and sub-processors. The CPU 193 may use any suitable memory 195, such as random access memory, read only memory, floppy disk drive, compact disc drive, hard disk, or any other form of digital storage, local or remote. Various support circuits may be coupled to the CPU 193 for supporting the process chamber 100. The controller 192 may be coupled to another controller that is located adjacent individual chamber components.

The controller 192 illustrated in FIG. 1 is configured to control at least the gas source 120, power source 130, remote plasma source 132, lift mechanism 126, electrode 136, electrode power supply 138, temperature control device 146, temperature control power source 148, and vacuum pump 154. In one embodiment, which can be combined with other embodiments, the controller 192 is configured to, when executed by a processor, cause one or more of the operations illustrated in method 400 of FIG. 4 to be carried out.

Figure 2:
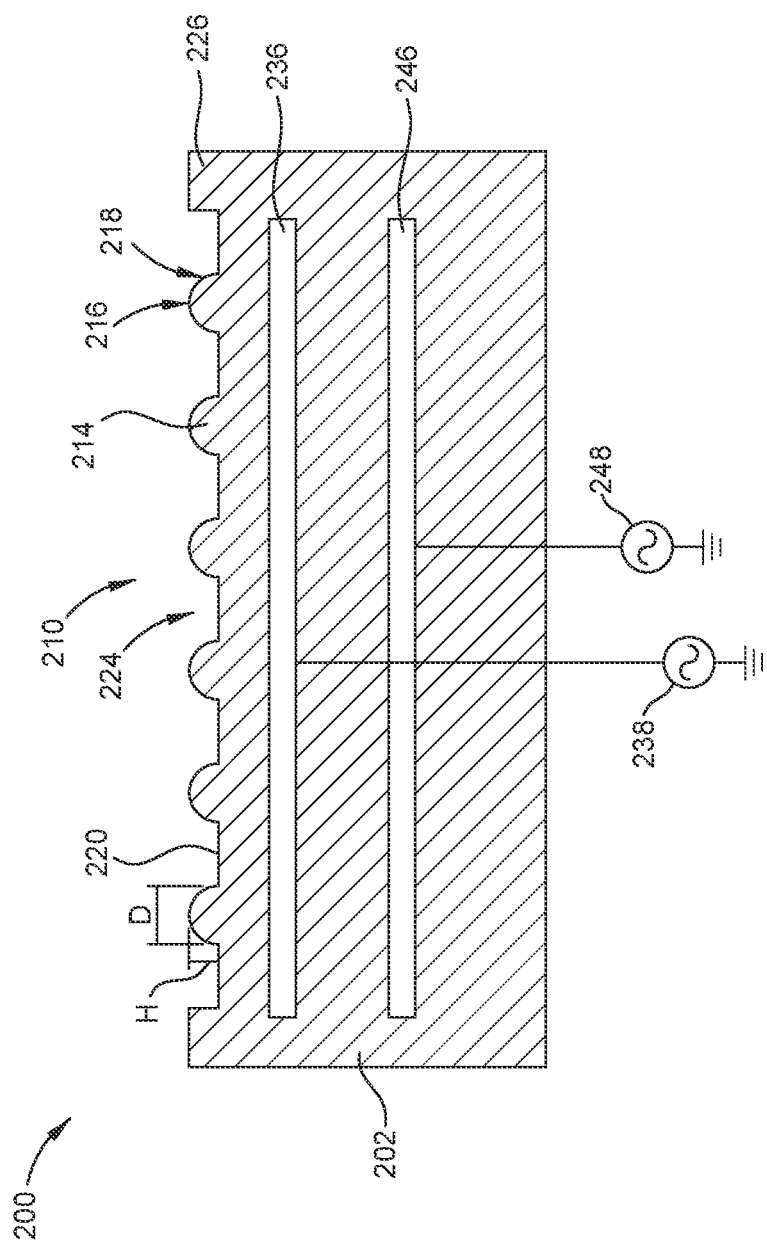
FIG. 2 illustrates a cross-sectional view of an exemplary substrate support according to an embodiment of the disclosure.

FIG. 2 is a cross-sectional view of an exemplary substrate support 204. The substrate support 204 may be used as the substrate support 104 of FIG. 1. The substrate support 204 has a body 202 formed from a dielectric material, such as a ceramic material. For example, the body 202 is formed from silicon nitride or silicon carbide. In some embodiments, the body 202 is formed from aluminum oxide or aluminum nitride.

In one embodiment, the body 202 has a desired resistivity in relation to an operating temperature thereof. For example, the resistivity of the body 202 may be increased by forming the body 202 from a material having a lower grain size. In some embodiments, the grain size of the body 202 is between about 1 µm and about 4 µm, such as between about 2 µm and about 3 µm. By forming the body 202 with a material having a smaller grain size, scratch damage to the backside of the substrate W during chucking may be reduced. Furthermore, the higher resistivity of the body 202 associated with smaller grain size decreases the voltage needed to provide an adequate chucking force to the substrate W, thus improving chucking performance of the substrate support 204.

An electrode 236 is disposed within the body 202. The electrode 236 is coupled to an electrode power supply 238 which provides an electric charge thereto to chuck the substrate W to the substrate support 204. The electrode 236 may be a single component or multiple discrete components across a diameter of the body 202, forming either a monopolar or bipolar electrostatic chuck. It is contemplated that the electrode 236 may be arranged in any suitable pattern, such as a grid, zig-zag, circular pattern, serpentine pattern, or the like. In some embodiments, the electrode 236 is disposed within an insulating layer (not shown) of the body 202.

In one embodiment, a temperature control device 246 coupled to a temperature control power source 248 is disposed within the body 202 to heat or cool the substrate support 204 to a desired temperature. In one example, the temperature control device 246 is a resistive heater. In another embodiment, the temperature control device 246 is a channel adapted to receive flow of a heated or cooled fluid, such as air, nitrogen, helium, water, glycol, or the like, therethrough to conduct heat to and/or from the body 202. The temperature control device 246 can heat the substrate support 204 to a temperature between about 300° C. and about 700° C., such as between about 550° C. and about 650° C. For example, the temperature control device 246 can heat the substrate support to a temperature of about 600° C.

The body 202 further includes an upper surface 210 having a substrate supporting region 224 and a ledge 226. The ledge 226 may be formed around the periphery of the upper surface 210 to define the substrate supporting region 224 therein. In one embodiment, the substrate supporting region 224 has a diameter substantially similar to that of the substrate W to be processed. For example, the substrate supporting region 224 has a diameter of about 200 mm, about 300 mm, about 450 mm, or the like. The substrate supporting region 224 further includes a plurality of substrate supporting features 214 disposed thereon. The substrate supporting features 214 extend upwardly from a substantially planar surface 220 of the body 202 and enable chucking of the substrate W without direct contact between the substrate W and the body 202.

In some examples, the substrate supporting features 214 are dimples, posts, or hemispherical protrusions having a substantially circular cross-section along a major horizontal plane of the substrate support 104. Each of the plurality of substrate supporting features 214 has a substrate supporting surface 216 with a rounded edge 218. In one embodiment, the rounded edge 218 creates a curved substrate supporting surface 216 having a full radius. In some embodiments, the substrate supporting surfaces 216 are parabolic or hemielliptic in shape. In other embodiments, the substrate supporting surfaces 216 are substantially planar. For example, the substrate supporting features 214 may be cylindrical and have substantially planar and circular substrate supporting surfaces 216 with circumferences defined by the rounded edges 218. Other morphologies are also contemplated for the substrate supporting features 214 and substrate supporting surfaces 216, such as substantially polygonal morphologies with rounded edges.

The rounded edges 218 may be formed by any suitable mechanical polishing means such as bead blasting, wet abrasive blasting, micro-blasting, and the like. Utilizing the aforementioned methods, it is possible to form a substrate supporting feature 214 having any desired shape, softness, and dimensions. Furthermore, the aforementioned methods may be utilized to reduce the average surface roughness (Ra) of the substrate supporting features 214, thus reducing backside damage of the substrate W during electrostatic chucking. In one embodiment, the substrate supporting features 214 have a surface roughness of between about 1 Ra and about 4 Ra, such as between about 2 Ra and about 3 Ra. In another embodiment, the substrate supporting features 214 have a surface roughness of between about 8 Ra and about 16 Ra, such as between about 10 Ra and about 14 Ra. In yet another embodiment, the substrate supporting features 214 have a surface roughness of between about 16 Ra and about 64 Ra, such as between about 18 Ra and about 22 Ra.

In one embodiment, the substrate supporting features 214 each have a diameter D of between about 0.25 mm and about 2.5 mm, such as between about 0.5 mm and about 2 mm. For example, the substrate supporting features 214 each have a diameter D of between about 0.75 mm and about 1.75 mm, such as between about 1 mm and about 1.5 mm. In one embodiment, the substrate supporting features 214 have a height H of between about 5 μm and about 75 μm, such as between about 10 μm and about 50 μm. For example, the substrate supporting features 214 have a height H of between about 20 μm and about 40 μm, such as about 25 μm and about 35 μm. In certain embodiments, the substrate supporting features 214 have a height H substantially similar to a height of the ledge 226. In other embodiments, the substrate supporting features 214 have a height H greater or less than the height of the ledge 226. It is further contemplated that the substrate supporting features 214 in a single substrate supporting region 224 may all have uniform dimensions or non-uniform dimensions.

In one embodiment, the substrate supporting region 224 has between about 50 and about 200 substrate supporting features 214 formed thereon. For example, the substrate supporting region 224 has between about 75 and about 100 substrate supporting features 214 formed thereon. The number of substrate supporting features 214 formed on the upper surface 210 partially depends on the dimensions of the substrate supporting region 224 and the distance between individual substrate supporting features 214. In one embodiment, the distance between individual substrate supporting features 214 is between about 0.1 mm and about 3 mm, such as between about 0.5 mm and about 1.5 mm. For example, the distance between individual substrate supporting features 214 is about 1 mm. In one embodiment, the ratio of the distance between individual substrate supporting features 214 and the diameter or length of the substrate supporting region 224 is between about 0.01 and about 0.2, such as between about 0.05 and about 0.15. For example, the ratio of the distance between individual substrate supporting features 214 and the diameter or length of the substrate supporting region 224 is about 0.1.

Figure 3:
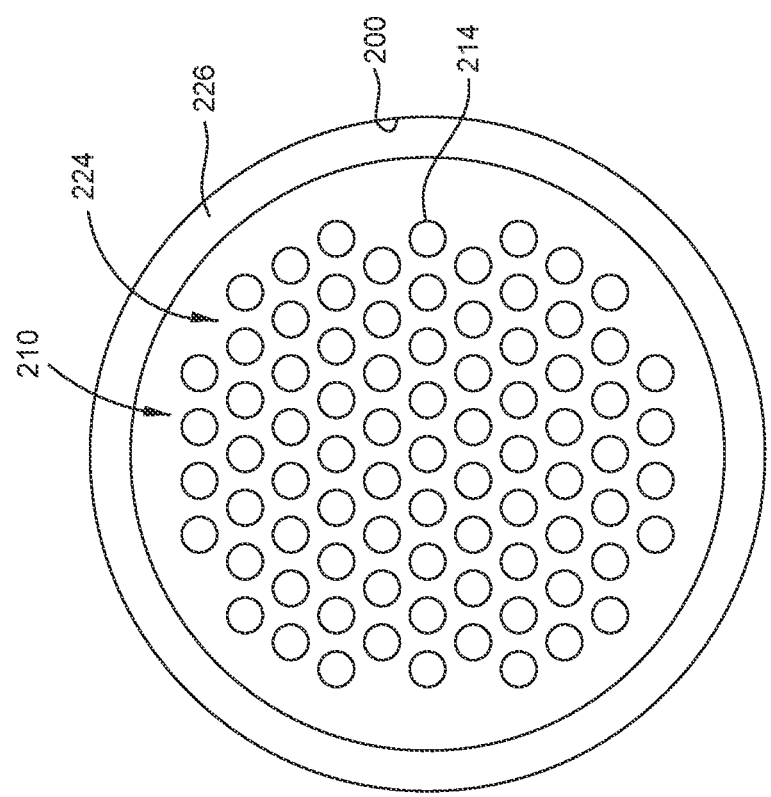
FIG. 3 illustrates a top-down view of the substrate support of FIG. 2.

FIG. 3 is a top down view of the substrate support 204 showing the upper surface 210 according to embodiments of the present disclosure. As depicted, the substrate support 204 includes 81 circular substrate supporting features 214 formed thereon and evenly distributed across the substrate supporting region 224. In some embodiments, the substrate supporting features 214 are distributed across the substrate supporting region 224 in a non-uniform arrangement. The substrate supporting features 214 may be disposed on the substrate supporting region 224 in any suitable arrangement, for example, concentric circles or hexagonal arrangements.

The number (e.g. density) and dimensions of the substrate supporting features 214 may be selected to improve electrostatic chucking of substrates. For example, increasing the number of substrate supporting features 214 may more evenly distribute the electrostatic forces of the electrode 236 across the backside of the substrate W and reduce bowing of the substrate W. Accordingly, contact between the substrate backside and the body 202 may be reduced. Alternatively, reducing the number of substrate supporting features 214 may reduce the amount of puncture and scratch damage to the backside of the substrate W during chucking due to contact between the substrate supporting features 214 and the substrate W. Thus, the density and dimensions of the substrate supporting features 214 reduce backside damage of the substrate W.

Figure 4:
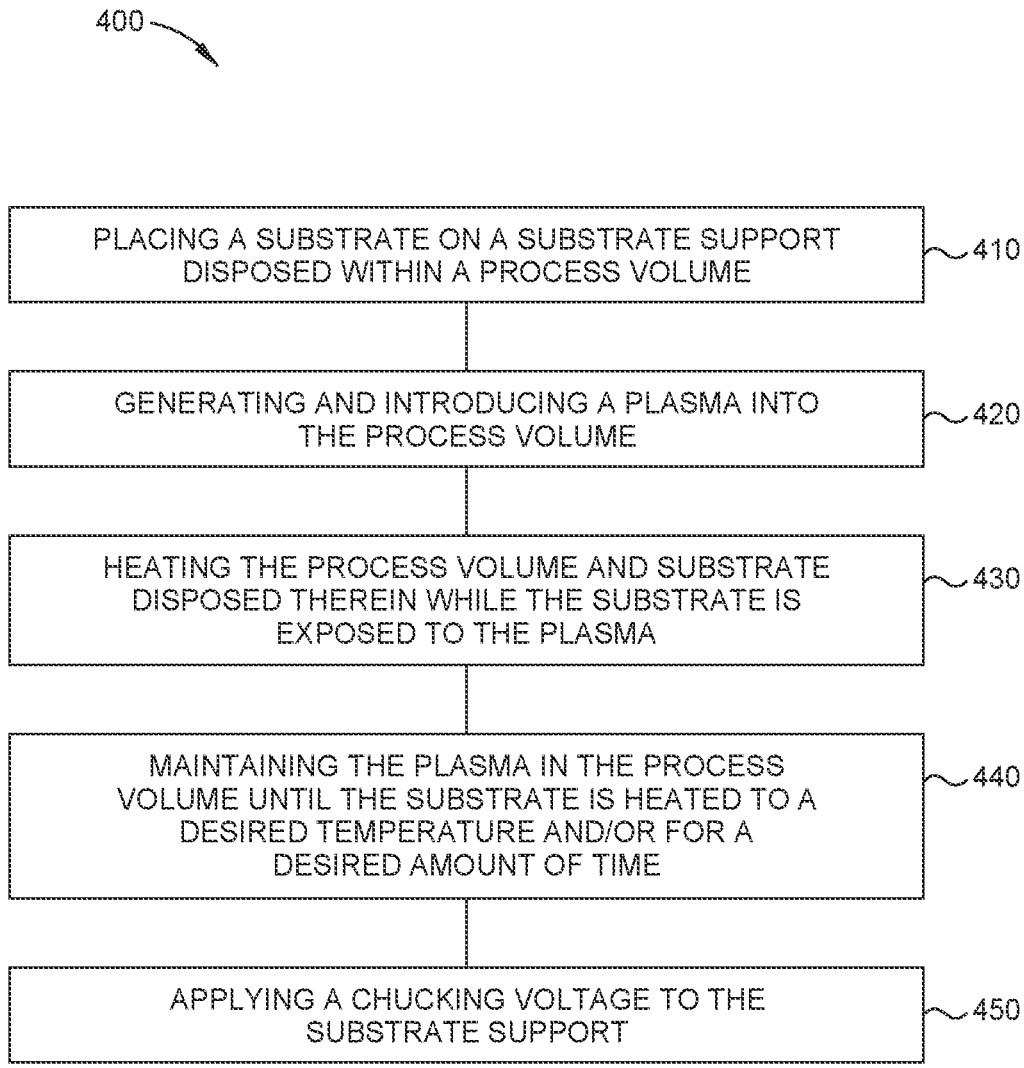
FIG. 4 illustrates operations of a method for chucking a substrate in a process chamber according to an embodiment of the disclosure.
Figure 5:
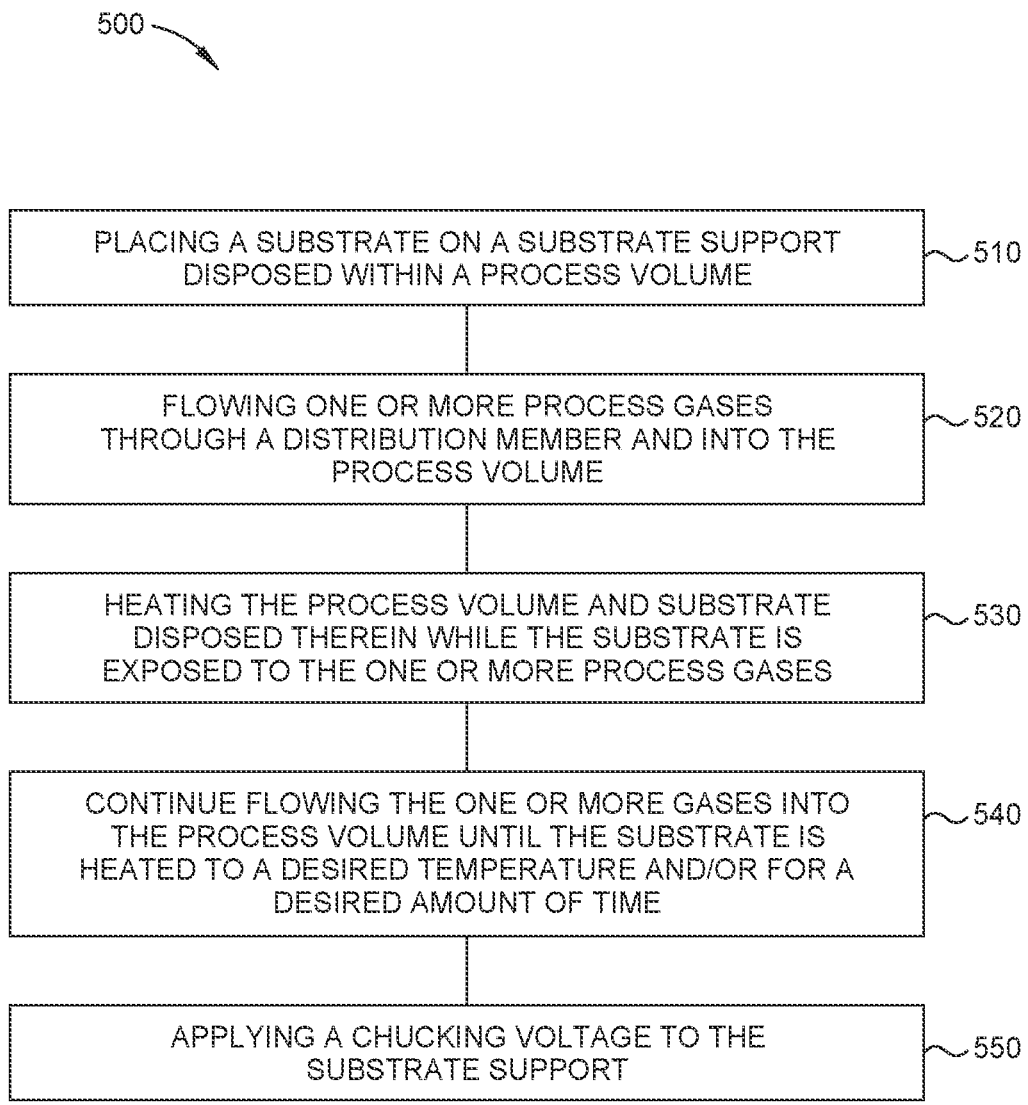
FIG. 5 illustrates operations of a method for chucking a substrate in a process chamber according to an embodiment of the disclosure.

FIGS. 4 and 5 illustrate operations of methods 400 and 500 for electrostatically chucking a substrate in a process chamber according to embodiments described herein. The methods 400 and 500 have multiple operations. The operations can be carried out in any suitable order or simultaneously (except where the context excludes the possibility), and the method can include one or more other operations which are carried out before any of the defined operations, between two of the defined operations, or after all of the defined operations (except where the context excludes the possibility). Further, the operations of the methods 400 and 500 are substantially similar except for the performance of different preheat treatments. Method 400 includes a plasma preheat treatment at operations 420-440, while method 500 includes a non-plasma process gas preheat treatment at operations 520-540.

As depicted in both FIGS. 4 and 5, the substrate is placed on a substrate support disposed within the process volume of a process chamber at operations 410 and 510. For example, the substrate W is transferred into the process chamber 100 through the opening 116 in the sidewalls 106 and placed on the upper surface 210 of the substrate support 104 having the substrate supporting features 214 formed thereon.

At operations 420, 430, and 440 of the method 400, the substrate W is exposed to a plasma preheat treatment. Accordingly, a plasma is generated and introduced into the process volume 101 at operation 420. The plasma generated at operation 420 may be a capacitively formed plasma, an inductively formed plasma, or a microwave formed plasma. In one embodiment, the plasma is generated in-situ within the process volume 101 by applying an RF power to a gas distribution member 112 as process gases are flowed therethrough. For example, the power source 130 applies RF power to the gas distribution member 112 as process gases pass through the plurality of openings 118 and into the process volume 101, thus energizing the process gases and generating a capacitively coupled plasma.

Alternatively, an RF coil may inductively couple RF power supplied by the power source 130 to the processes gases in the process volume 101 to generate an inductively coupled plasma. In another embodiment, the plasma is formed by a remote plasma source 132 and flowed into the process volume 101 through the gas conduit 114 or other opening, such as inlet 134, in the chamber body 102. In still other embodiments, the plasma is formed both in-situ (i.e. within the process volume 101) and remotely (e.g. outside of the process volume 101).

The power source utilized to generate the plasma, such as the power source 130, applies a power of between about 100 Watts and about 5000 Watts. For example, the power source 130 applies a power of between about 500 Watts and about 2000 Watts to generate the plasma for the preheat treatment, such as between about 750 Watts and about 1500 Watts. In another example, the power source 130 applies a power of about 1000 Watts to generate the plasma for the preheat treatment.

In one embodiment, the plasma is formed of one or more inert process gases. For example, the plasma may be formed from one or more of argon, nitrogen, helium, or other suitable inert chemistries. In some embodiments, the plasma is formed from one or more of oxygen, ammonia, and the like. The one or more inert process gases are flowed into the process volume 101 with a flow rate of between about 500 standard cubic centimeters per minute (sccm) an about 5000 sccm, such as a flow rate of between about 1000 sccm and about 3000 sccm. For example, the process gases are flowed into the process volume 101 with a flow rate of between about 1500 sccm and about 2500 sccm, such as a flow rate of about 2000 sccm.

At operation 430, the process volume 101 and the substrate W disposed therein are heated while the substrate W is exposed to the plasma generated at operation 420. For example, the temperature control power source 248 provides power to the temperature control device 246 disposed within the substrate support 204 to modulate the temperature of the process volume 101 and the substrate W. In one embodiment, the process volume 101 and substrate W are heated to a temperature between about 300° C. and about 700° C., such as between about 500° C. and about 650° C. For example, the process volume 101 and substrate W are heated to a temperature between about 525° C. and about 625° C., such as between about 550° C. and about 600° C., such as about 575° C.

At operation 440, the plasma is maintained in the process volume 101 until the substrate W is heated to a desired temperature and/or for a desired amount of time. In one embodiment, the plasma is maintained in the process volume 101 for a time period of between about 10 seconds and about 200 seconds, such as about 50 seconds and 150 seconds, depending on the operating temperatures utilized. For example, the plasma is maintained in the process volume 101 for a time period of between about 75 seconds and about 125 seconds, such as a time period of about 100 seconds. Generally, as a residence time of the plasma within the process volume 101 is increased, a flow rate of the process gases is decreased.

During the generation, introduction, and maintenance of the plasma at operations 420-440 described above, the process chamber 100 is maintained a pressure of between about 4 Torr and about 10 Torr, such as between about 6 Torr and about 8 Torr. For example, the process chamber 100 is maintained at a pressure of about 7 Torr.

Alternatively to the plasma preheat treatment of operations 420-440, the substrate W may be exposed to a non-plasma process gas preheat treatment as depicted in operations 520, 530, and 540 of the method 500. At operation 520, one or more process gases are flowed through a gas distribution member 112 and into the process volume 101. In one embodiment, the one or more process gases are inert process gases, including but not limited to helium, argon, nitrogen, and the like. The one or more process gases are flowed into the process volume 101 at a flow rate between about 500 sccm and about 10000 sccm, such as a flow rate between about 1000 sccm and about 8000 sccm. For example, the process gases are flowed into the process volume 101 at a flow rate between about 2000 sccm and about 6000 sccm, such as a flow rate between about 2500 sccm and about 5000 sccm.

At operation 530, the process volume 101 and the substrate W disposed therein are heated in a manner substantially similar to that described with reference to operation 430 while being exposed to the one or more process gases. For example, the process volume 101 and substrate W are heated to a temperature between about 300° C. and about 700° C., such as between about 500° C. and about 650° C. For example, the process volume 101 and substrate W are heated to a temperature between about 525° C. and about 625° C., such as between about 550° C. and about 600° C., such as about 575° C.

At operation 540, the process gases continue to be flowed into the process volume 101 until the substrate W is heated to a desired temperature and/or for a desired amount of time. Similar to the plasma preheat treatment of FIG. 4, the processing time for the process gas preheat treatment may be between about 10 seconds and about 200 seconds, such as between about 10 seconds and about 150 seconds, depending on the operating temperatures utilized. For example, the process gases may be flowed into the process volume 101 for a time period of between about 10 seconds and about 100 seconds, such as a time period of about 50 seconds. Generally, as the processing time for the preheat treatment is increased, a flow rate of the process gases into the process volume 101 is decreased.

During the process gas preheat treatment described in operations 520-540 above, the process chamber 100 is maintained at a pressure between about 1 Torr and about 20 Torr, such as between about 4 Torr and about 16 Torr. For example, the process chamber 100 is maintained at a pressure between about 8 Torr and about 12 Torr, such as about 10 Torr.

For either method 400 or 500, the substrate W may be preheated while being either indirectly or directly disposed above the substrate support 104. In one embodiment, the substrate W is directly disposed upon and contacting one or more substrate supporting surfaces of the substrate support, such as the substrate supporting features 214 on the upper surface 210 of the substrate support 204. In another embodiment, the preheat operations are carried out while the substrate W is raised away from the upper surface 210 of the substrate support 204 by one or more movable lift pins disposed through the substrate support 204. In yet another embodiment, the substrate is preheated while the substrate W is first raised on the lift pins and subsequently lowered onto the substrate support 204. For example, a first portion of the preheat treatment may be carried out while the substrate W is disposed on one or more lift pins, and a second portion of the preheat treatment may be carried out while the substrate W is disposed on the substrate supporting features 214.

Figure 6:
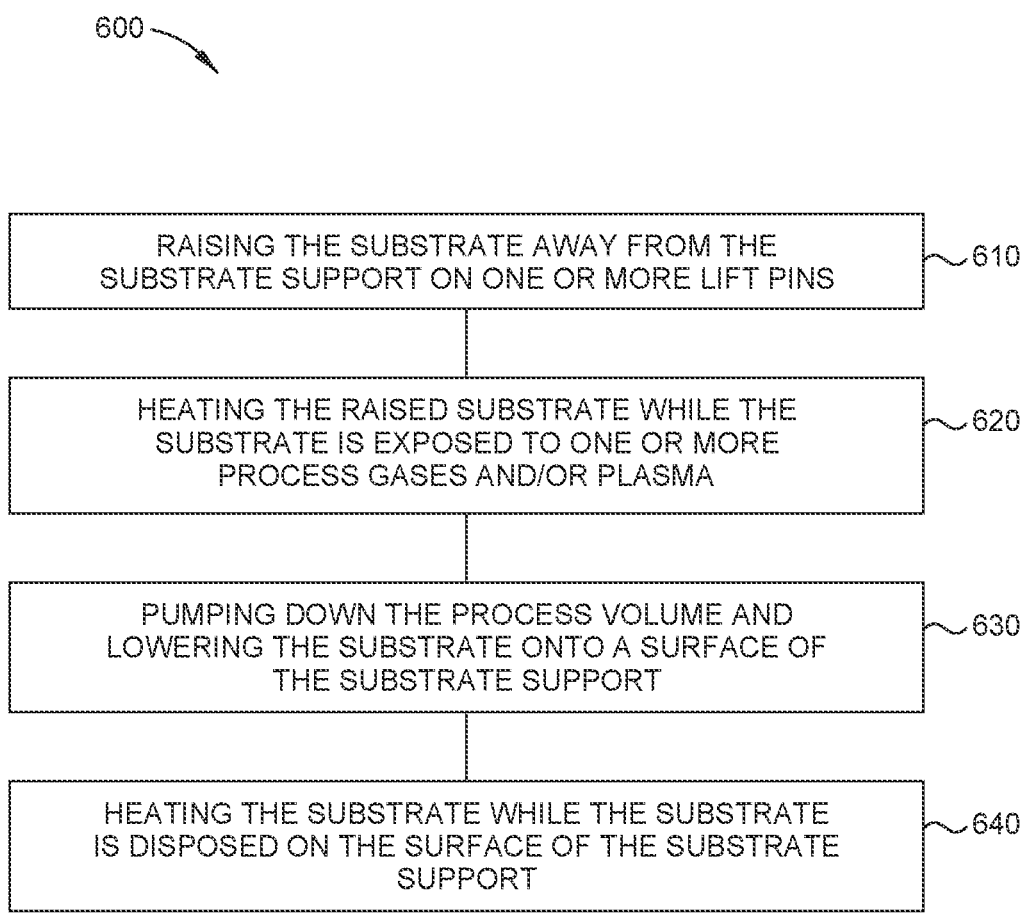
FIG. 6 illustrates operations of a method for heating a substrate in a process chamber according to an embodiment of the disclosure.

FIG. 6 illustrates operations of a method 600 where the substrate is first heated while being raised on lift pins and subsequently heated while being directly disposed on the substrate support 204. The method 600 has multiple operations. The operations can be carried out in any suitable order or simultaneously (except where the context excludes the possibility), and the method can include one or more other operations which are carried out before any of the defined operations, between two of the defined operations, or after all of the defined operations (except where the context excludes the possibility).

The method 600 begins at operation 610 by raising the substrate W away from the upper surface 210 of the substrate support 204 on one or more lift pins. For example, the substrate W is raised a distance between about 0.5 mm and about 10 mm from the substrate support 204, such as a distance between about 1 mm and about 8 mm, such as a distance between about 2 mm and about 6 mm, such as a distance about 4 mm.

At operation 620, the process volume 101 and the raised substrate W are heated while being exposed to the plasma or process gases of methods 400 and 500. For example, as described above, the process volume 101 and the substrate W are heated to a temperature between about 300° C. and about 700° C., such as between about 450° C. and about 550° C. In one aspect of operation 620, the substrate W is heated for a time period between about 10 seconds and about 120 seconds, such as between about 25 seconds and about 45 seconds, for example between about 30 seconds and about 40 seconds. Heating the substrate W at a raised position within the process volume 101 enables efficient and uniform heating throughout the substrate W by substantially reducing or eliminating contact between the substrate backside and the substrate support 204, where the temperature control device 246 is disposed. Thus, the plasma and process gases within the process volume 101 are more uniformly distributed around all sides of the substrate W during the preheat process, reducing uneven application of heat to the substrate W.

After the substrate W is heated to a desired temperature and/or for a desired amount of time, the process volume 101 is pumped down and the substrate W is lowered onto the upper surface 210 of the substrate support 204 at operation 630. In one embodiment, the process volume 101 is pumped down by stopping the flow of the one or more process gases into the process volume 101 and exhausting any residual gases therein through the exhaust 152, thus reducing the pressure within the process volume 101. In one embodiment, the process volume 101 is pumped down for between about 1 second and about 45 seconds, such as between about 5 seconds and about 30 seconds, such as between about 10 seconds and about 20 seconds. Pumping down the process volume 101 in between heating of the substrate W on the one or more lift pins and heating of the substrate W on the substrate support 204 prevents sliding of the substrate W during transfer between the two positions.

At operation 640, the process volume 101 and the lowered substrate W, now directly contacting the substrate support 204, are further heated while exposed to plasma or process gases. Similar to operation 620, the process volume 101 and the substrate W are heated to a temperature between about 300° C. and about 700° C., such as between about 450° C. and about 550° C. In one aspect of operation 640, the substrate W is heated for a time period between about 30 seconds and about 100 seconds, such as between about 25 seconds and about 45 seconds. By first heating the substrate W in a raised position and then heating the substrate W in a lowered position, sliding of the substrate W along the substrate supporting surface 216 due to thermal expansion is reduced, thus reducing the formation of defects on the substrate backside.

Returning now to methods 400 and 500, upon performance of the preheat treatment, a chucking voltage is applied to the substrate support 204 at operations 450 and 550 to electrostatically chuck (ESC) the preheated substrate W to the substrate supporting features 214 on the upper surface 210 thereof. By performing the preheat treatment described above prior to operations 450 and 550, the amount of backside scratch damage incurred by the substrate W during chucking and subsequent high-temperature processing is significantly reduced. This reduction in backside damage is enabled by minimizing the amount of thermal expansion of the substrate W during electrostatic chucking and subsequent processes. As a result of the initial preheat of the substrate W, the substrate W is already thermally expanded prior to chucking. Thus, sliding of the backside of the substrate W against the substrate support 204 is significantly reduced when the chucking voltage is applied, minimizing the amount of scratch damage caused by friction between the substrate backside and the substrate supporting surfaces 216 of the substrate supporting features 214.

In one embodiment, the chucking voltage applied to the substrate support 204 at operations 450 and 550 is a constant chucking voltage. The chucking voltage applied at operation 450 and 550 has a value between about 500 V and about 1000 V, such as between about 600 V and about 900 V. For example, the chucking voltage has a value between about 700 V and about 800 V, such as about 750 V.

In another embodiment, a variable chucking voltage is applied to the substrate support 204 at operations 450 and 550. For example, in one aspect, a first chucking voltage is applied to the substrate support 204 and then increased to a second chucking voltage. In embodiments herein, the first chucking voltage is between about 200V and about 700V, and the second chucking voltage is between about 500V and about 1500V. The rate of voltage increase between the first chucking voltage and the second chucking voltage is between about 100 V/s and about 1000 V/s, such as between about 200 V/s and about 800 V/s, such as about 500 V/s. When combined with the preheat treatment described above, slow chucking of the substrate W further reduces the amount of backside damage caused to the substrate W as compared to conventional methods.

It is contemplated that one or more of the aspects disclosed herein may be combined to eliminate or minimize damage to the backside of a substrate. These approaches include forming a plurality of substrate supporting features having rounded edges on the substrate support with a ratio of the distance between individual features to the diameter or length of a substrate supporting region being between about 0.01 and about 0.2. Furthermore, it is contemplated that by exposing the substrate to a preheat treatment prior to electrostatically chucking the substrate, backside damage caused by substrate thermal expansion may be reduced. The application of the aspects described herein may reduce the amount of substrate backside damage incurred during semiconductor device processing by about 30-80%, and may result in a 30-80% gain in lithography process yield. Increasing lithography process yield improves overall integrated circuit fabrication as lithography processes account for about one-third of integrated circuit manufacturing costs.

Additional benefits of the present disclosure include improved chucking of substrates to substrate support surfaces, timely and efficient adaptation to changing equipment properties, enhanced throughput yield, and lower operational costs.

While the foregoing is directed to embodiments of the present disclosure, other and further embodiments of the disclosure may be devised without departing from the basic scope thereof, and the scope thereof is determined by the claims that follow.

What is claimed is:

1. A substrate support, comprising:
   a body formed of a material comprising a grain size between about 1 µm and about 4 µm;
   an electrode disposed within the body;
   a temperature control device disposed within the body; and
   a plurality of substrate supporting features formed on a substrate supporting region of the substrate support, the plurality of substrate supporting features comprising between about 75 and about 100 substrate support features, each of the substrate supporting features having a substrate supporting surface and a rounded edge, wherein a distance between each substrate supporting feature is between about 0.7 mm and 3 mm, and wherein each of the plurality of substrate supporting features have a surface roughness between about 2 Ra and about 3 Ra.

2. The substrate support of claim 1, wherein each of the plurality of substrate supporting features has a diameter between about 0.5 mm and about 2 mm.

3. The substrate support of claim 2, wherein each of the plurality of substrate supporting features has a height between about 16 µm and about 50 µm.

4. The substrate support of claim 1, wherein the substrate supporting surface of each of the plurality of substrate supporting features is substantially planar.

5. The substrate support of claim 1, wherein the grain size is between about 2 µm and about 3 µm.

6. The substrate support of claim 1, further comprising a ledge formed around an upper surface of the substrate support to define the substrate supporting region.

7. A substrate support, comprising:
  a body formed of a material comprising a grain size between about 1 μm and about 4 μm;
  an electrode disposed within the body;
  a temperature control device disposed within the body; and
  a plurality of substrate supporting features formed on a substrate supporting region of the substrate support, each of the substrate supporting features having a substrate supporting surface and a rounded edge, wherein a distance between each substrate supporting feature is between about 0.7 mm and 3 mm, and wherein each of the plurality of substrate supporting features have a surface roughness between about 1 Ra and about 4 Ra.

8. The substrate support of claim 7, wherein the substrate supporting surface of each of the plurality of substrate supporting features is substantially planar.

9. The substrate support of claim 8, wherein the grain size is between about 2 μm and about 3 μm.

10. The substrate support of claim 9, wherein each of the plurality of substrate supporting features has a diameter between about 0.5 mm and about 2 mm.

11. The substrate support of claim 10, wherein each of the plurality of substrate supporting features has a height between about 16 μm and about 50 μm.

12. A substrate support, comprising:
  a body formed of a material comprising a grain size between about 1 μm and about 4 μm;
  an electrode disposed within the body;
  a temperature control device disposed within the body; and
  a plurality of substrate supporting features formed on a substrate supporting region of the substrate support, the plurality of substrate supporting features comprising between about 50 and about 200 substrate support features, each of the substrate supporting features having a substrate supporting surface and a rounded edge, and wherein a distance between each substrate supporting feature is between about 0.7 mm and 3 mm.

13. The substrate support of claim 12, wherein each of the plurality of substrate supporting features have a surface roughness between about 8 Ra and about 16 Ra.

14. The substrate support of claim 12, wherein each of the plurality of substrate supporting features have a surface roughness between about 16 Ra and about 64 Ra.

15. The substrate support of claim 12, wherein a ratio of a distance between adjacent substrate supporting features and a diameter of the substrate supporting region is between about 0.05 and about 0.15.

16. The substrate support of claim 12, wherein the plurality of substrate supporting features comprises between about 75 and about 100 substrate support features.

17. The substrate support of claim 12, wherein each of the plurality of substrate supporting features has a height between about 16 μm and about 50 μm.

* * * * *